US012642077B2

(12) United States Patent
Anderson et al.

(10) Patent No.: US 12,642,077 B2
(45) Date of Patent: May 26, 2026

(54) INTEGRATED CIRCUIT CHIP WITH BACKSIDE POWER DELIVERY AND MULTIPLE TYPES OF BACKSIDE TO FRONTSIDE VIAS

(71) Applicant: International Business Machines Corporation, Armonk, NY (US)

(72) Inventors: Brent A. Anderson, Jericho, VT (US); Nicholas Anthony Lanzillo, Wynantskill, NY (US); Ruilong Xie, Niskayuna, NY (US); Lawrence A. Clevenger, Saratoga Springs, NY (US); Albert M. Chu, Nashua, NH (US); Nicholas Alexander Polomoff, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 619 days.

(21) Appl. No.: 17/931,767

(22) Filed: Sep. 13, 2022

(65) Prior Publication Data

US 2024/0088037 A1 Mar. 14, 2024

(51) Int. Cl.
*H10W 20/41* (2026.01)
*H10W 20/00* (2026.01)
*H10W 20/44* (2026.01)

(52) U.S. Cl.
CPC ....... *H10W 20/427* (2026.01); *H10W 20/056* (2026.01); *H10W 20/435* (2026.01); *H10W 20/4421* (2026.01)

(58) Field of Classification Search
CPC ........... H01L 23/5286; H01L 21/76877; H01L 23/5283; H01L 23/53228; H01L 23/481;

H01L 21/76898; H10W 20/427; H10W 20/056; H10W 20/435; H10W 20/4421; H10W 20/0234; H10W 20/0242; H10W 20/0245; H10W 20/0249; H10W 20/20; H10W 20/2125; H10W 20/2134; H10W 20/481; H10W 20/023
See application file for complete search history.

(56) References Cited

U.S. PATENT DOCUMENTS

| 7,973,416 B2 | 7/2011 | Chauhan |
| 9,142,620 B2 | 9/2015 | Ritenour |
| 9,299,640 B2 | 3/2016 | Lin |
| (Continued) | | |

FOREIGN PATENT DOCUMENTS

| EP | 4588103 A1 | 7/2025 |
| WO | 2024/057133 A1 | 3/2024 |

OTHER PUBLICATIONS

International Application No. PCT/IB2023/058742 Notification of Transmittal of the International Search Report and the Written Opinion, mailed Nov. 27, 2023, 13 pgs.
(Continued)

*Primary Examiner* — Thanh T Nguyen
(74) *Attorney, Agent, or Firm* — Kimberly Zillig

(57) ABSTRACT

A semiconductor device that includes a first via connecting a backside of the semiconductor device to a frontside of the semiconductor device, and a second via connecting the backside of the semiconductor device to the frontside of the semiconductor device. The first via and the second via are directly connected to at least one different wiring level on the frontside or the backside.

18 Claims, 8 Drawing Sheets

(56) References Cited

U.S. PATENT DOCUMENTS

| | | | |
|---|---|---|---|
| 10,636,739 B2 | 4/2020 | Beyne | |
| 11,158,580 B2 | 10/2021 | Sio | |
| 2011/0233702 A1 | 9/2011 | Takahashi | |
| 2012/0193785 A1* | 8/2012 | Lin | H01L 21/76898 |
| | | | 257/737 |
| 2018/0145030 A1 | 5/2018 | Beyne | |
| 2018/0240797 A1* | 8/2018 | Yokoyama | H10D 84/0149 |
| 2019/0096751 A1 | 3/2019 | Sato | |
| 2020/0075483 A1* | 3/2020 | Zhou | H01L 23/53228 |
| 2020/0373242 A1 | 11/2020 | Hiblot | |
| 2021/0111115 A1 | 4/2021 | Patrick | |
| 2021/0134721 A1 | 5/2021 | Chiang | |
| 2021/0202385 A1 | 7/2021 | Huang | |
| 2021/0225830 A1 | 7/2021 | Liu | |
| 2021/0305252 A1 | 9/2021 | Chiang | |
| 2021/0305381 A1 | 9/2021 | Chiang | |
| 2021/0336001 A1 | 10/2021 | Yang | |
| 2021/0351303 A1 | 11/2021 | Ju | |
| 2021/0357565 A1 | 11/2021 | Fang | |
| 2021/0376071 A1 | 12/2021 | Liu | |
| 2021/0376093 A1 | 12/2021 | Chu | |
| 2021/0391421 A1 | 12/2021 | Chu | |
| 2022/0254737 A1* | 8/2022 | Wang | H01L 21/6835 |
| 2022/0406886 A1* | 12/2022 | Chuang | H10D 30/0221 |
| 2023/0290840 A1* | 9/2023 | Akkaya | H01L 23/5226 |

OTHER PUBLICATIONS

R. Chen et al., "Design and Optimization of SRAM Macro and Logic Using Backside Interconnects at 2nm node," 2021 IEEE International Electron Devices Meeting (IEDM), 2021, pp. 22.4.1-22.4.4, doi: 10.1109/IEDM19574.2021.9720528.

Response to communication pursuant to Rule 161(1) dated Apr. 25, 2025, Application No. 23768637.3, IBM Patent Reference, 3 pages.

\* cited by examiner

600

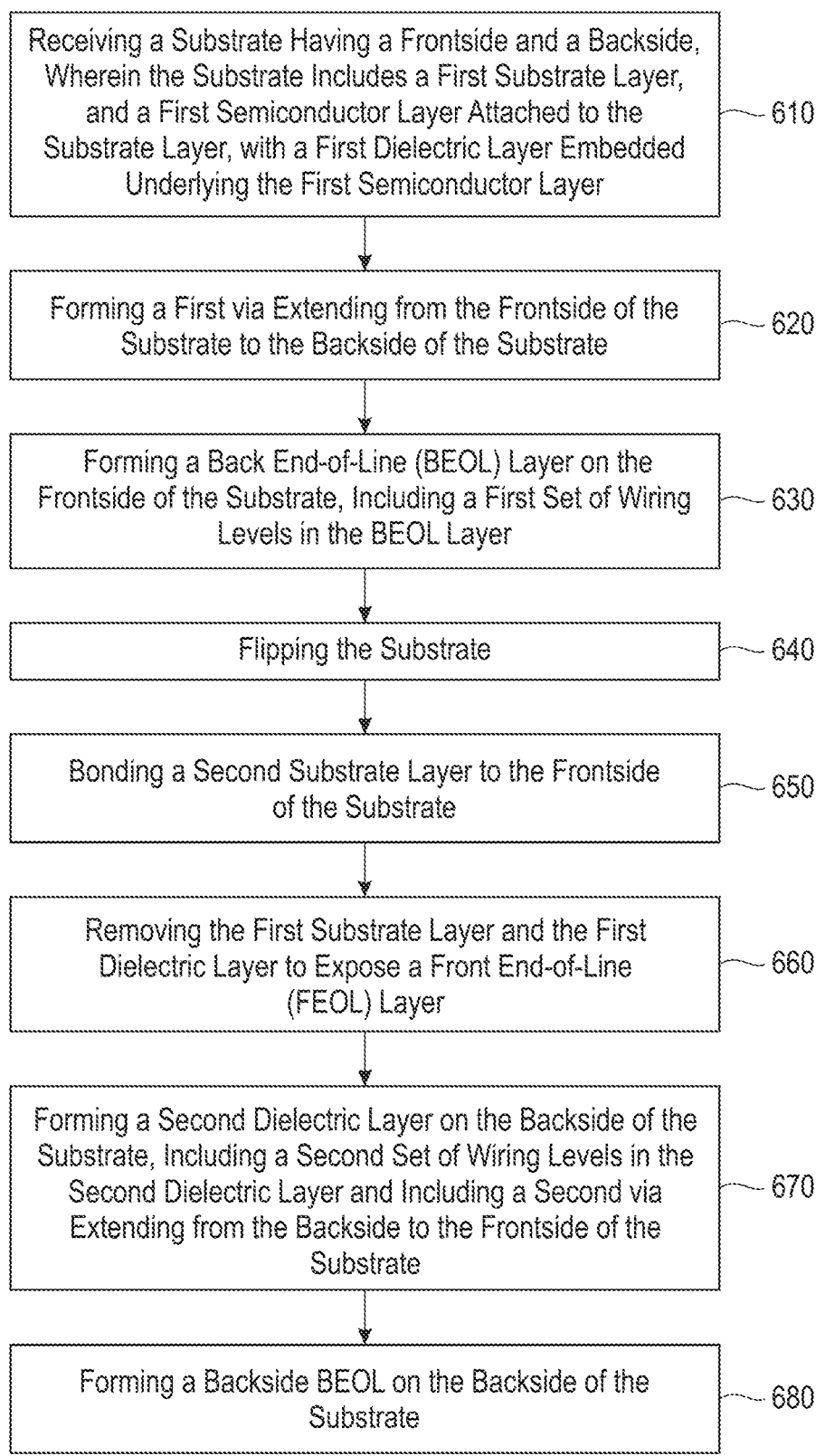

Receiving a Substrate Having a Frontside and a Backside, Wherein the Substrate Includes a First Substrate Layer, and a First Semiconductor Layer Attached to the Substrate Layer, with a First Dielectric Layer Embedded Underlying the First Semiconductor Layer — 610

Forming a First via Extending from the Frontside of the Substrate to the Backside of the Substrate — 620

Forming a Back End-of-Line (BEOL) Layer on the Frontside of the Substrate, Including a First Set of Wiring Levels in the BEOL Layer — 630

Flipping the Substrate — 640

Bonding a Second Substrate Layer to the Frontside of the Substrate — 650

Removing the First Substrate Layer and the First Dielectric Layer to Expose a Front End-of-Line (FEOL) Layer — 660

Forming a Second Dielectric Layer on the Backside of the Substrate, Including a Second Set of Wiring Levels in the Second Dielectric Layer and Including a Second via Extending from the Backside to the Frontside of the Substrate — 670

Forming a Backside BEOL on the Backside of the Substrate — 680

FIG. 6

INTEGRATED CIRCUIT CHIP WITH BACKSIDE POWER DELIVERY AND MULTIPLE TYPES OF BACKSIDE TO FRONTSIDE VIAS

BACKGROUND

The present disclosure relates to integrated circuit (IC) chips. More particularly, the present disclosure provides semiconductor structures, with first and second frontside (FS) to backside (BS) vias, and related processes.

Semiconductor processing for the fabrication of IC chips continues to evolve towards increasing device density. Higher numbers of active devices (mainly transistors) of ever decreasing device dimensions are placed on a given surface of semiconductor material. This has put a strain on design and fabrication of IC chips.

SUMMARY

According to some embodiments of the disclosure, there is provided a semiconductor device. The semiconductor device includes a first via connecting a backside of the semiconductor device to a frontside of the semiconductor device, and a second via connecting the backside of the semiconductor device to the frontside of the semiconductor device. The first via and the second via are directly connected to at least one different wiring level on the frontside or the backside.

According to some embodiments of the disclosure, there is provided a semiconductor device that includes a first set of vias connecting a backside of the semiconductor device to a frontside of the semiconductor device, and a second set of vias connecting the backside of the semiconductor device to the frontside of the semiconductor device. The at least one via of the first set of vias and at least one via of the second set of vias are directly connected to at least one different wiring level on the frontside or the backside.

According to some embodiments of the disclosure, there is provided a method of making a semiconductor device. The method includes operations of: receiving a substrate having a frontside and a backside, wherein the substrate includes a first substrate layer, and a first semiconductor layer attached to the substrate layer, and a first dielectric layer embedded underlying the first semiconductor layer; forming a first via extending from the frontside of the substrate to the backside of the substrate; flipping the substrate; bonding a second substrate layer to the frontside of the substrate; removing the first substrate layer and the first dielectric layer to expose a front end-of-line (FEOL) layer; forming a second dielectric layer on the backside of the substrate, including a second set of wiring levels in the second dielectric layer and including a second via extending from the backside to the frontside of the substrate; and, forming a backside BEOL on the backside of the substrate.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 6 is a flow diagram of a process of forming a semiconductor device, in accordance with embodiments of the disclosure.

Figure 1:
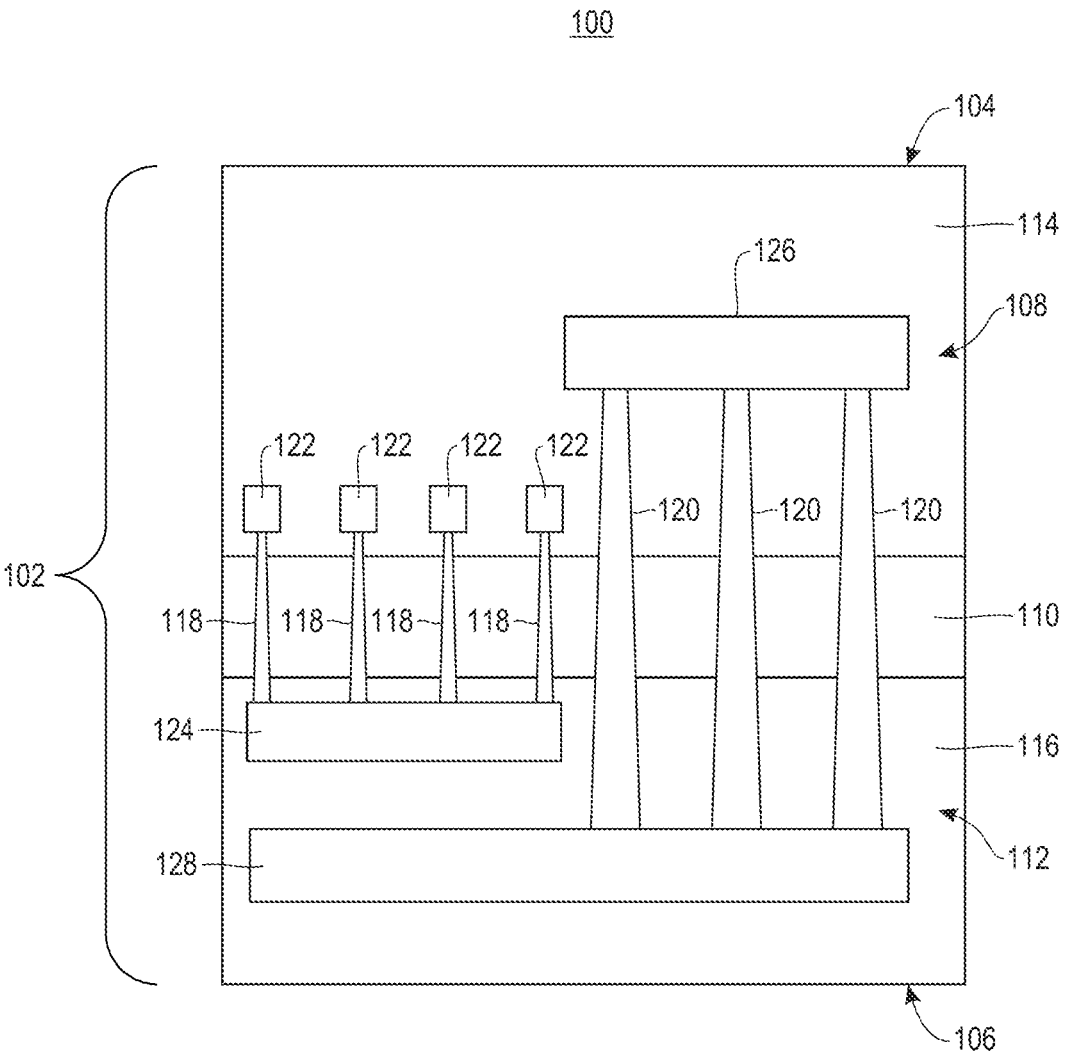
FIG. 1 is a schematic illustration of a cross-sectional view of a portion of a semiconductor device, in accordance with embodiments of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate to integrated circuit chips, hereafter abbreviated to ICs or IC chips. More particularly, the present disclosure provides semiconductor structures, with first and second frontside (FS) to backside (BS) vias, and related processes. While the present disclosure is not necessarily limited to such applications, various aspects of the disclosure can be appreciated through a discussion of various examples using this context.

Traditionally, interconnects between the front end of line (FEOL) of IC chips (consisting mainly of active devices and contact terminals of the IC chips) are incorporated in the back end of line (BEOL) of the IC chip (i.e., semiconductor structure). Such interconnects include a stack of metallization layers on top of the FS and include layers of circuitry connected by vertical via connections. A power delivery network (PDN) can be formed by conductors and vias connected to drain supply/source supply (VDD/VSS) terminals of IC chips, for example, for delivering power to the individual active devices in the FS. The integration of the PDN in the BEOL, however, has become particularly challenging because of an evolution towards increased device density.

Embodiments of the present disclosure relate to IC chips with BS power delivery and multiple types of BS to FS vias. Such IC chips can include at least two different types of vias extending from a BS to a FS. The at least two different types of vias can differ in size, such as width, material, etc., and can connect different wiring levels. Embodiments of the present disclosure also relate to processes for forming IC chips including multiple types of BS to FS vias.

One feature and advantage of the disclosed structures can include, and the processes can provide, multiple types of via configurations for products utilizing BS power distribution. Another feature and advantage of the disclosed structures and processes is that BS interconnects for signal routing in the disclosed semiconductor structures can address a challenge of FS congestion of such semiconductor structures.

Yet another feature and advantage of the disclosed structures and processes is the inclusion of high performance vias can be formed later in the process and can bridge different metallization levels in the semiconductor structures. Such high performance vias can provide significantly improved power delivery over nano-vias intended to supply power or signals to single transistors in a device layer in the FS of the semiconductor structure. A further feature and advantage of the disclosed processes to form IC chips with multiple BS to FS vias is that they do not have a relatively high cost or complexity compared to processes for formation of IC chips without the multiple BS to FS vias.

For the sake of brevity, conventional techniques related to semiconductor device and IC fabrication may or may not be described in detail herein. Moreover, the various tasks and process steps or operations described herein can be incorporated into a more comprehensive procedure or process having additional operations or functionality not described in detail herein.

FIG. 1 is a schematic illustration of a cross-sectional view of a portion of a semiconductor structure 100, in accordance with embodiments of the disclosure. The semiconductor structure 100 includes a stack 102 having a FS 104 and a BS 106. The stack 102 includes a front side back end-of-line (FS BEOL) portion 108, which further includes a layer 110 of devices, and a back side back end-of-line (BS BEOL) portion 112. The devices (not shown) can include e.g., transistors, resistors, capacitors, diodes, etc. The FS BEOL portion 108 can include a FS interconnect structure that can include a plurality of FS metallization layers (not shown) disposed within and surrounded by a FS dielectric layer 114. The FS metallization layers (not shown) can include vertical interconnects, such as vias or contacts, and horizontal interconnects, such as metal lines (not shown). The BS BEOL portion 112 can also include a BS interconnect structure that can further include metallization layers (not shown) and vias, for example. The BS BEOL portion 112 can also include a BS dielectric layer 116.

As shown in FIG. 1, vias can extend between the FS BEOL portion 108 and the BS BEOL portion 112. In particular, consistent with some embodiments, a first set (plurality) of vias 118 extends between the FS BEOL portion 108 and the BS BEOL portion 112, and a second set (plurality) of vias 120 extends between the FS BEOL portion 108 and the BS BEOL portion 112. The first set of vias 118 and the second set of vias 120 are different types of vias. Different types of vias can differ based on, e.g., size (such as width), cross-sectional shape, material, etc. The first set of vias 118 includes a first FS wiring level 122 and a first BS wiring level 124 in the FS BEOL portion 108 and the BS BEOL 112, respectively. The second set of vias 120 connects a second FS wiring level 126 and a second BS wiring level 128 in the FS BEOL portion 108 and the BS BEOL 112, respectively. As shown, the first FS wiring level 122 is different from the second FS wiring level 126, and the first BS wiring level 124 is different from the second BS wiring level 128. The first and second BS wiring levels 124, 128 can be included in an area generally referred to as a BS power delivery network (PDN).

Figure 2:
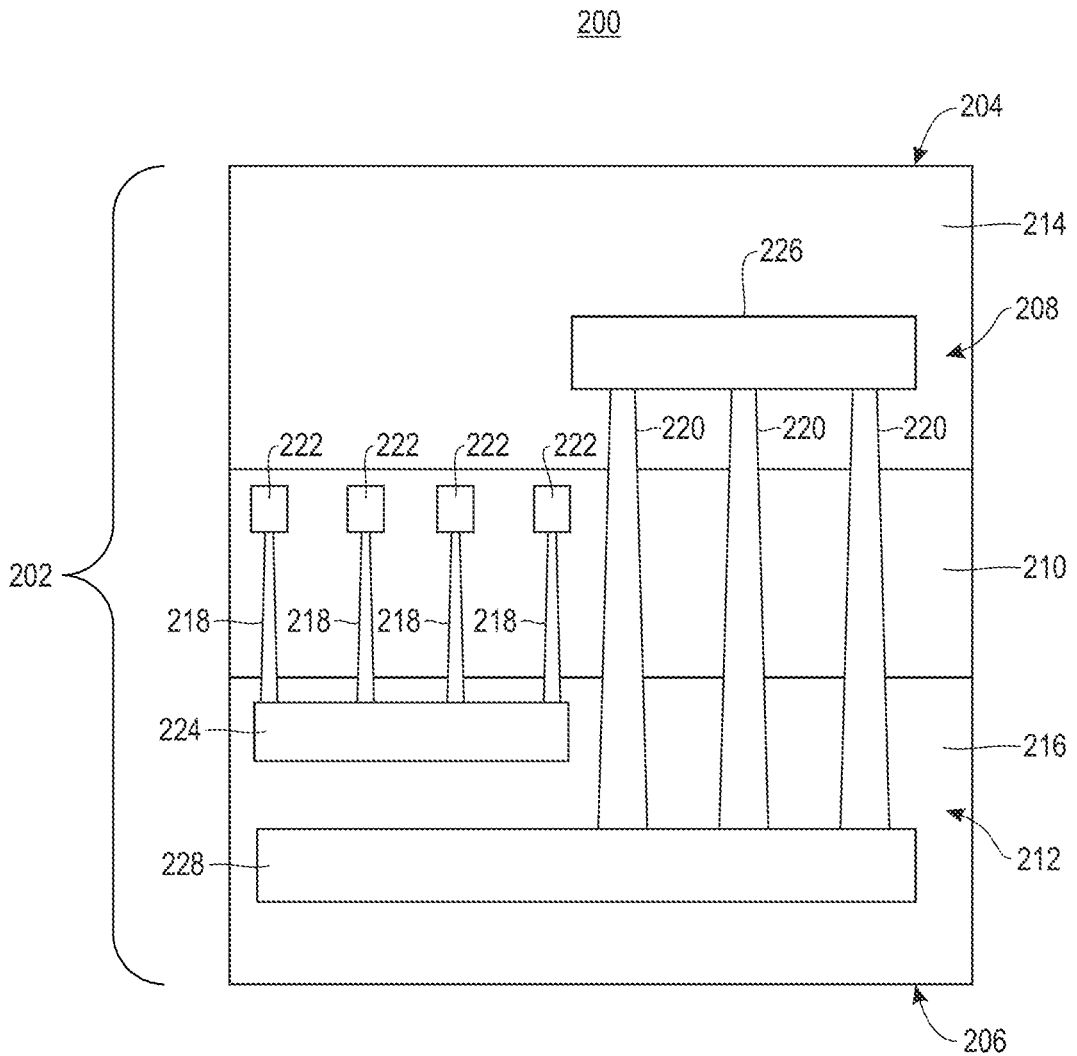
FIG. 2 is a schematic illustration of a cross-sectional view of a portion of a semiconductor device, in accordance with embodiments of the disclosure.

FIG. 2 is a schematic illustration of a cross-sectional view of a portion of a semiconductor structure 200, in accordance with embodiments of the disclosure. The semiconductor structure 200 includes a stack 202 having a FS 204 and a BS 206. The stack 202 includes a FS BEOL portion 208, which further includes a layer 210 of devices, and a BS BEOL portion 212. The devices (not shown) can include e.g., transistors, resistors, capacitors, diodes, etc. The FS BEOL portion 208 can include a FS interconnect structure that can include a plurality of FS metallization layers (not shown) disposed within and surrounded by a FS dielectric layer 214. The FS metallization layers (not shown) can include vertical interconnects, such as vias or contacts, and horizontal interconnects, such as metal lines (not shown). The B S BEOL portion 212 can also include a BS interconnect structure that can further include metallization layers (not shown) and vias, for example. The BS BEOL portion 212 can also include a BS dielectric layer 216.

As shown in FIG. 2, vias can extend between the FS BEOL portion 208 and the BS BEOL portion 212. In particular, consistent with some embodiments, a first set (plurality) of vias 218 extends between the device layer 210 and the BS BEOL portion 212, and a second set (plurality) of vias 220 extends between the FS BEOL portion 208 and the BS BEOL portion 212. The first set of vias 218 and the second set of vias 220 are different types of vias. Different types of vias can differ based on, e.g., size (such as width), cross-sectional shape, material, etc.

The first set of vias 218 includes a first FS wiring level 222 and a first BS wiring level 224 in the device layer 210 and the BS BEOL 212, respectively. The second set of vias 220 includes a second FS wiring level 226 and a second BS wiring level 228 in the FS BEOL portion 208 and the BS BEOL 212, respectively. The first and second BS wiring levels 224, 228 can be included in a structure generally referred to as a BS PDN.

For purposes of this disclosure, reference will be made to an illustrative process flow With reference to the attached figures, various illustrative embodiments of the processes and structures disclosed herein will now be described in more detail.

FIGS. 3A-3F include schematic illustrations of cross-sectional views of a portion of a chip 300 through operations of an example process, in accordance with embodiments of the disclosure. The attached drawings present various views of one illustrative embodiment of a process or method to form the chip 300 with first and second FS to BS vias 318, 320 (or first and second sets of vias). Although only two different types of vias are illustrated, it is contemplated by the disclosure that more than two, and multiple sets of, vias can be included.

Figure 3A:
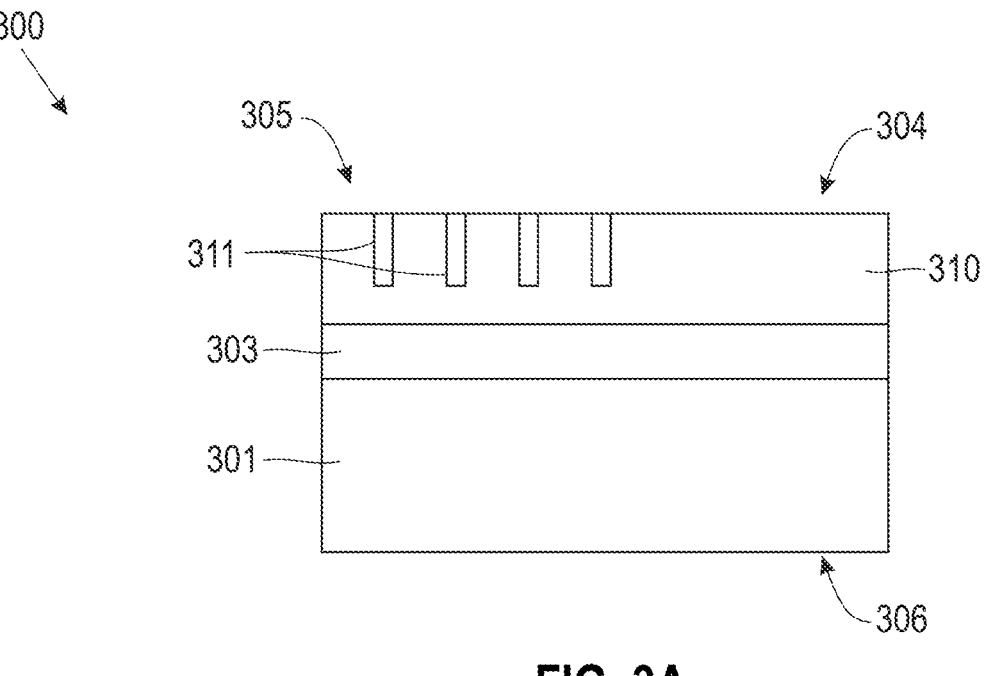
FIGS. 3A-3F illustrate cross-sectional views of a chip after a series of operations of a process are performed in order to form a semiconductor device, in accordance with embodiments of the disclosure.

FIG. 3A illustrates a portion of the chip 300 in an early stage of fabrication. The chip 300 includes a substrate 305 that includes a first substrate layer 301, a dielectric layer 303 and a semiconductor, or device, layer 310, including a plurality of devices 311, in accordance with embodiments of the disclosure. The portion of the chip 300 in FIG. 3A can be a "semiconductor-on-insulator substrate," such as a silicon-on-insulator (SOI) substrate, a silicon germanium-on-insulator (SGOI) substrate, or a germanium-on-insulator (GOI) substrate, for example. In embodiments, the device layer 310 can include silicon, silicon germanium, germanium, or other suitable semiconductor, for example. The first substrate layer 310 can be part of a silicon wafer, for example. The dielectric layer 303 can be silicon oxide, for example. Other suitable materials for the layers 301, 303 and 310 are also contemplated. A semiconductor-on-insulator substrate can be fabricated using separation by implantation of oxygen (SIMOX), wafer bonding, and/or other suitable methods.

Figure 3B:
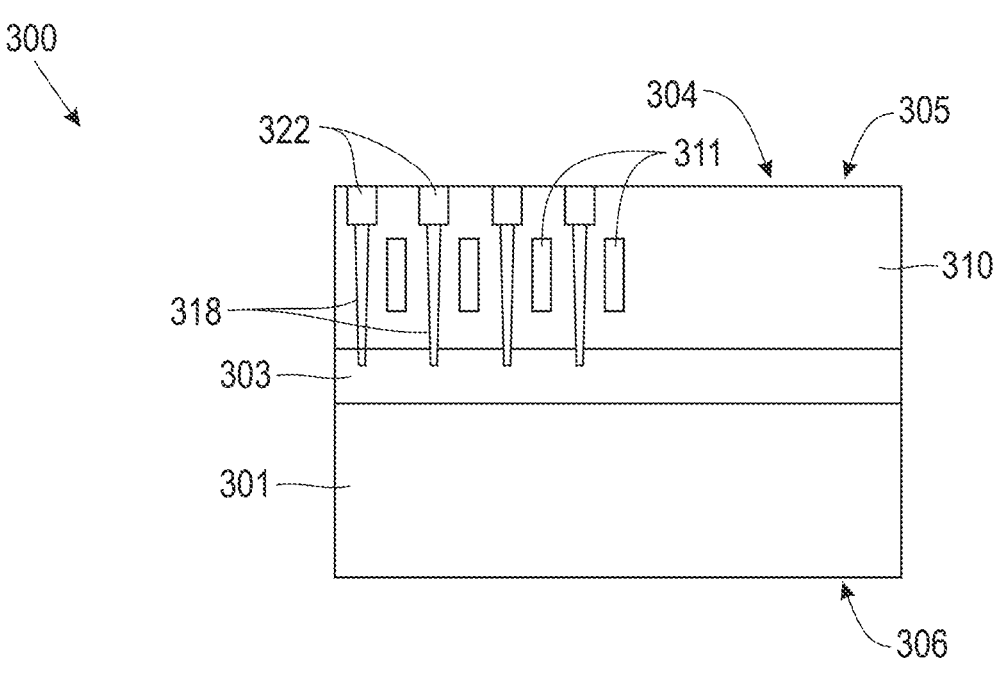

FIG. 3B illustrates a next operation in fabrication of the chip 300, in accordance with embodiments of the disclosure. As shown, a first set of FS to BS vias 318 that extend from the device layer 310 to the dielectric layer 303. The vias 318 can be formed using known lithography and etch techniques, such as by single or double damascene processing. Dual-damascene processing can be characterized by patterning vias and trenches, in such a way that the metal deposition fills both at the same time.

Figure 3C:
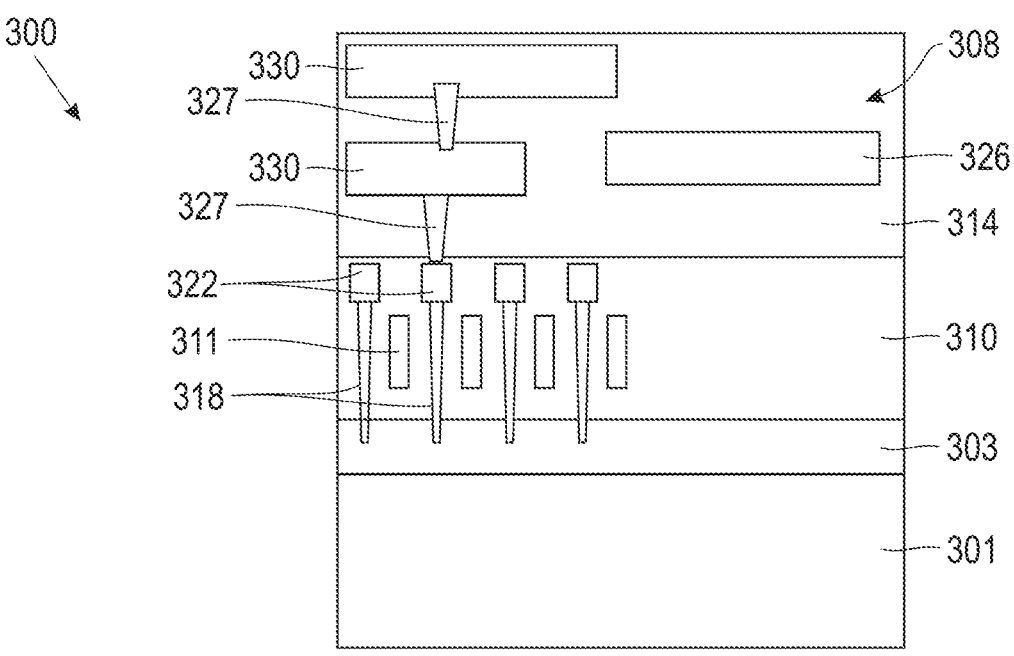

FIG. 3C illustrates another operation in forming the chip 300, in accordance with embodiments of the disclosure. A FS BEOL portion 308, or layer, can be added adjacent the device layer 310. BEOL layers, such as the FS BEOL layer 308, can be formed by dielectric stack depositions, masking and etching to form lines and via openings, metallization, and polishing. The FS BEOL portion 308 can include one or more FS metallization (or wiring) layers 326, 330 disposed within and surrounded by a FS dielectric layer 314. The FS metallization layers 326, 330 can be oriented perpendicular to the FS to BS vias 318, as shown. One or more FS vias 327 can be formed and extend between two (2) of the FS metallization layers 326, 330, as shown. One embodiment of forming a configuration of FS metallization layers 326, 330 and FS vias 327 is shown, and other configurations are contemplated by the disclosure. Wires can be used to electrically connect devices to form circuits, which are then wired up to power supplies and additional circuits. The purpose of the BEOL is to interconnect all the devices to form complex chips with Logic, Memory, I/Os, etc.

Figure 3D:
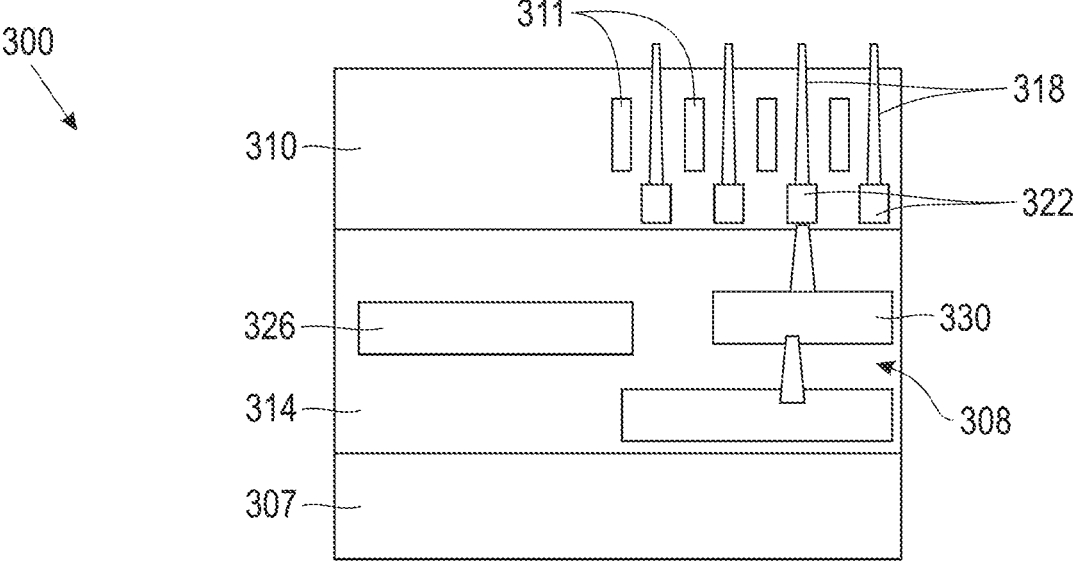

FIG. 3D illustrates the chip portion 300 after being flipped and bonded to a second substrate layer 307. The second substate layer 307 can be bonded using a thin oxide layer that can be formed on both wafer surfaces and then the two wafers can be brought together and exposed to heat and pressure to join the oxide layers. Oxide to oxide bonding is a standard industry bonding technique. The first substrate layer 301 and the dielectric layer 303 are shown removed from the chip 300. The first substrate layer 301 and dielectric layer 303 can be removed by, for example, polishing to thin the first substrate layer 301 and then etching by reactive ion etching (RIE) or chemical etching techniques.

Figure 3E:
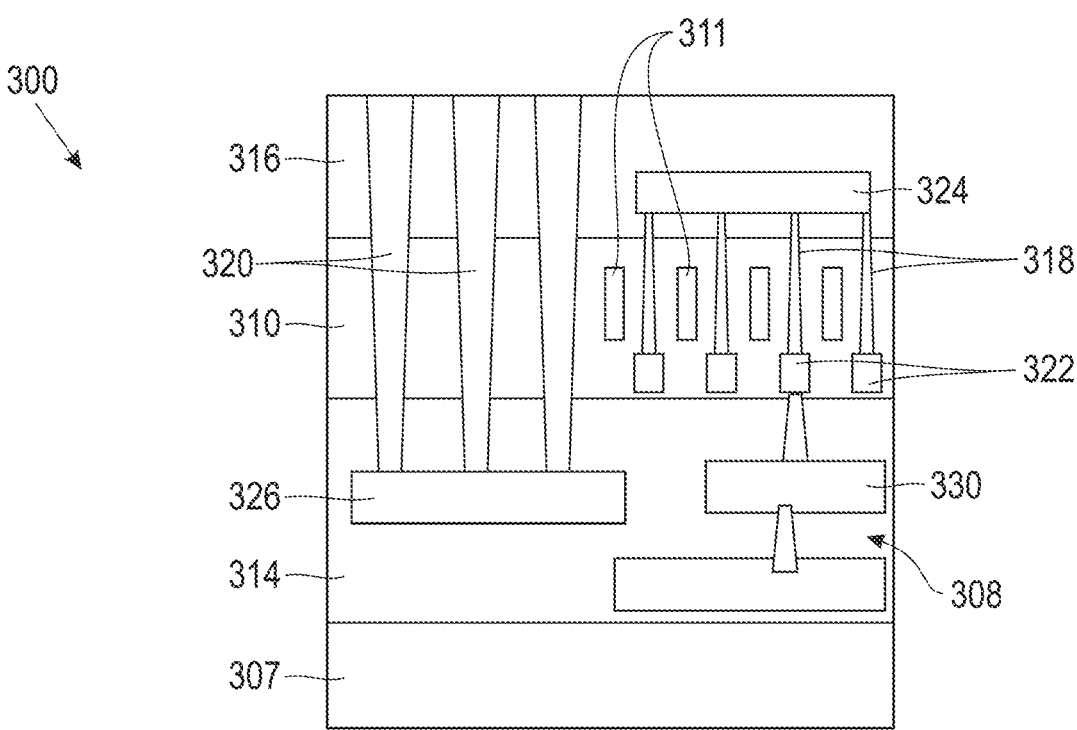

FIG. 3E illustrates another operation in forming the chip 300, in accordance with embodiments of the disclosure. A BS BEOL portion 312, that includes a BS dielectric layer 316, is shown added adjacent the device layer 310 or front end-of-line (FEOL). The BS dielectric layer 316 can be formed by dielectric deposition followed by masking to form lines and vias. A second set (plurality) of vias 320 can be formed between the FS BEOL portion 308 and the BS BEOL portion 312 (i.e., the BS and FS). The vias 320 can be formed using lithography and etch techniques, such as by single or double damascene processing.

The first set of vias 318 and the second set of vias 320 can be different types of vias. Different types of vias can differ based on, e.g., size (such as width), cross-sectional shape, material, etc. The first set of vias 318 includes a first FS wiring level 322 and a first BS wiring level 324 in the FS BEOL portion 308 and the BS dielectric layer 316, respectively. In some embodiments, the first set and second set of vias 318, 320 can be directly connected to at least one different wiring level.

Figure 3F:
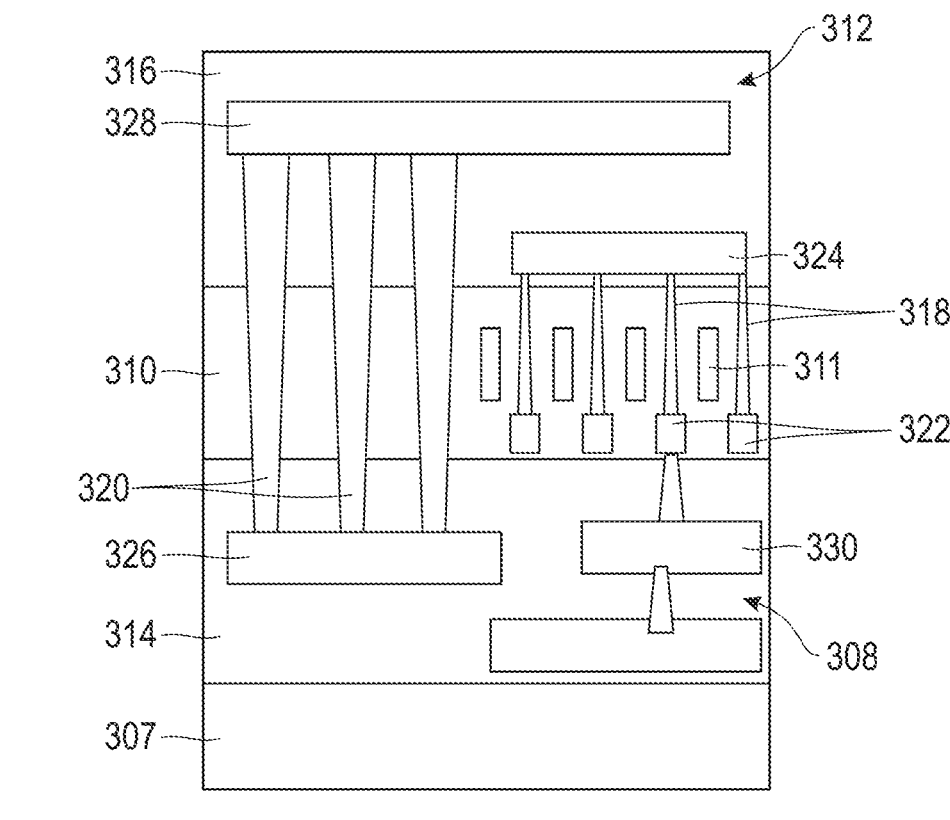

FIG. 3F illustrates another operation in forming the chip 300, in accordance with embodiments of the disclosure. A BS BEOL 312 is formed, which includes a second BS wiring level 328. BEOL layers, such as the BS BEOL 312, can be formed by dielectric stack depositions, masking and etching to form lines and via openings, metallization, and polishing. The second set of vias 320 includes a second FS wiring level 326 and the second BS wiring level 328 in the FS BEOL portion 308 and the BS BEOL 312, respectively.

In the chip 300, in some embodiments, the first and second sets of vias 318, 320 can terminate on different metallization layers/lines (or planes) in the chip 300. The first set of vias 318 can be located adjacent to a source/drain (S/D) regions (not shown), for example, and the second set of vias 320 can be located adjacent to shallow trench isolation (STI) regions (not shown), or vice versa. The vias 318 or 320 can have dielectric barrier protection (see FIG. 5) in a STI/silicon region, for example, which can be optionally removed in oxide/ultra-low K (ULK) regions, for example.

The first and second sets of vias 318, 320 can be made of different metals. For example, one set of vias can be made of copper while another set of vias can be made of another metal, such as ruthenium, tungsten, etc. A width of each via of the first set of vias 318 can, for example, be greater than 1.5 times a width of each via of the second set of vias 320.

Figure 4:
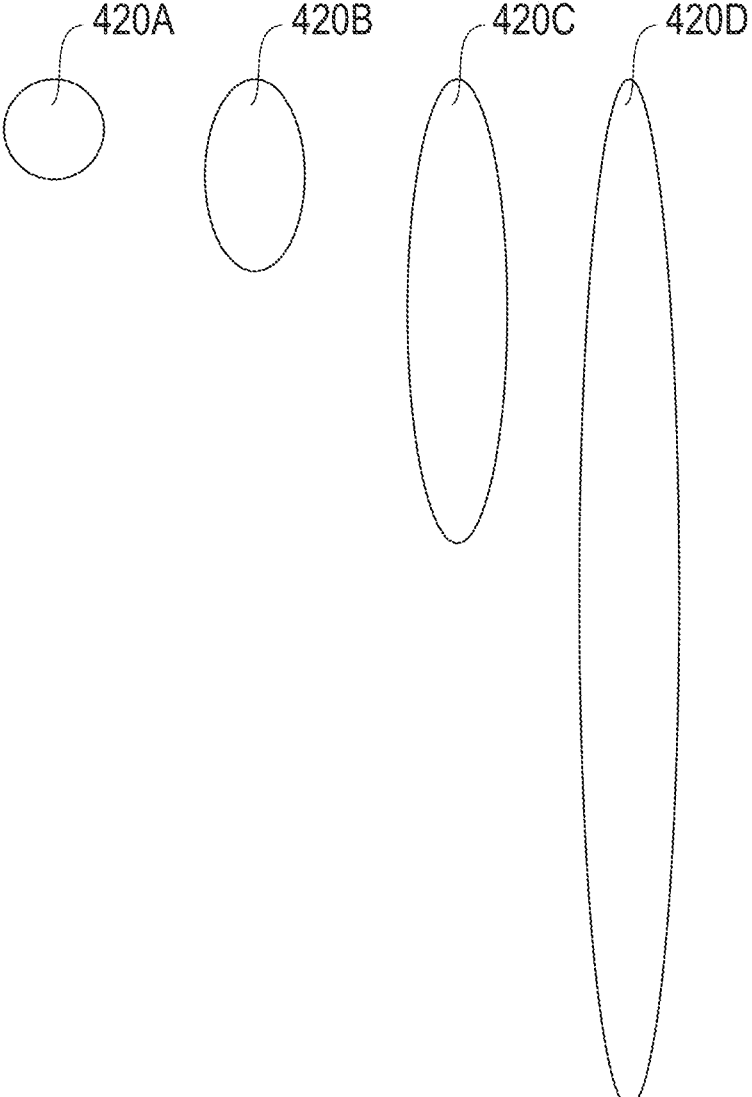
FIG. 4 is a schematic illustration of top views of vias of a semiconductor device, in accordance with embodiments of the disclosure.

FIG. 4 is a schematic illustration of top views of vias 420A-D of a semiconductor device (or chip), in accordance with embodiments of the disclosure. The vias described herein above (118, 120, 218, 220, 318, 320) can have a variety of different cross-sectional shapes from a top-down view. Some examples include a circular shape, as in via 420A, an elliptical shape, as in via 420B, an extended, elliptical shape, as in via 420C, and a "long bar" shape (i.e., elongated ellipse), as in via 420D. Other suitable shapes are also contemplated by the disclosure.

Figure 5:
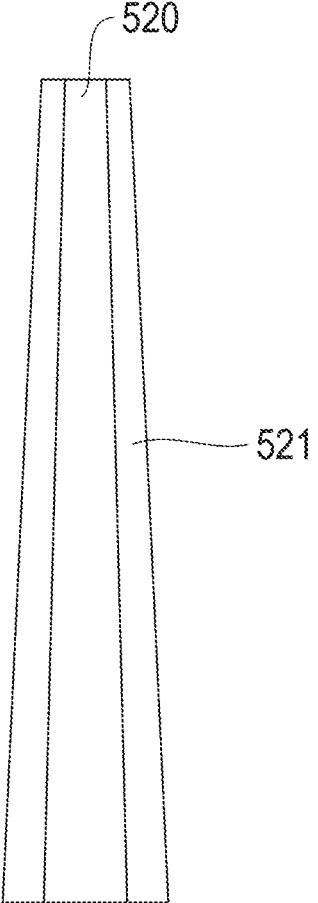
FIG. 5 is a schematic illustration of a cross-sectional view of a via of a semiconductor device, in accordance with embodiments of the disclosure.

FIG. 5 is a schematic illustration of a cross-sectional view of a via 520 of a semiconductor device (or chip), in accordance with embodiments of the disclosure. One example embodiment of a via that can be included in the semiconductor devices disclosed herein is via 520. The via 520 includes a layer of dielectric material 521 (i.e., a dielectric barrier) that surrounds the via 520 within the semiconductor device. An advantage of the dielectric material layer 521 is to provide additional electrical shorting isolation between the via 520 and adjacent structures.

FIG. 6 is a flow diagram of a process 600 of forming or making the chip 300 (using FIGS. 3A-3F, as an example), in accordance with embodiments of the disclosure. At operation 610, the process 600 includes receiving a substrate 305 having a FS 304 and a BS 306, wherein the substrate 305 includes a first substrate layer 301, and a first semiconductor layer 310 attached to the substrate layer 301, with a first dielectric layer 303 embedded underlying the first semiconductor layer 310. At operation 620, the process 600 further includes forming a first via 318 extending from the FS 304 of the substrate 305 to the BS 306 of the substrate 305. The process 600 also includes an operation 630 of forming a BEOL layer 308 on the FS 304 of the substrate 305, including a first set of wiring levels 336, 330 in the BEOL layer 308. The process 600 further includes an operation 640 of flipping the substrate 305. Additionally, at operation 650, the process 600 includes bonding a second substrate layer to the FS of the substrate. The process 600 additionally includes an operation 660 of removing the first substrate layer 301 and the first dielectric layer 303 to expose the device layer 310 or FEOL. In addition, the process 600 includes an operation 670 of forming a second dielectric layer 316 on the BS 306 of the substrate 305 (or a BS BEOL 312), including a second set of wiring levels 324 in the second dielectric layer 316 and including a second via 320 extending from the BS 306 to the FS 304 of the substrate 305. Further, the process 600 includes an operation 680 of forming the BS BEOL 312 on the BS 306 of the substrate 305. In the process, wherein the first via 318 can include a first plurality of vias and the second via 320 can include a second plurality of vias.

For purposes of description herein, the terms "upper," "lower," "top," "bottom," "left," "right," "rear," "front," "vertical," "horizontal," "frontside," "backside," and derivatives thereof shall relate to the devices as oriented in the figures. However, it is to be understood that the devices can assume various alternative orientations and step sequences, except where expressly specified to the contrary. It is also to be understood that the specific devices and processes illustrated in the attached drawings, and described in the following disclosure, are simply exemplary embodiments of the inventive concepts defined in the appended claims. Hence, other physical characteristics relating to the embodiments disclosed herein are not to be considered as limiting, unless the claims expressly state otherwise.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone or in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged and/or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A semiconductor device comprising:
 a first plurality of vias connecting a backside metallization level of the semiconductor device to a frontside metallization level of the semiconductor device; and
 a second plurality of vias connecting the backside metallization level of the semiconductor device to the frontside metallization level of the semiconductor device,
 wherein the first plurality of vias are connected to a first single wiring level and the second plurality of vias are connected to a second single wiring level, and wherein the first plurality of vias and the second plurality of vias extend continuously from the backside metallization level to the frontside metallization level.

2. The semiconductor device of claim 1, wherein the first plurality of vias and the second plurality of vias are dual damascene.

3. The semiconductor device of claim 1, wherein the first single wiring level and the second single wiring level is located on the frontside metallization level or the backside metallization level.

4. The semiconductor device of claim 1, wherein the first plurality of vias and the second plurality of vias are made of different metals.

5. The semiconductor device of claim 1, wherein the first plurality of vias are made of copper.

6. The semiconductor device of claim 1, wherein the first plurality of vias has a first width and the second plurality of vias has a second width, and the first width is greater than one and a half times the second width.

7. The semiconductor device of claim 1, further comprising:
 one or more source/drain regions,
 wherein the second plurality of vias are adjacent to at least one of the one or more source/drain regions.

8. The semiconductor device of claim 1, wherein the first plurality of vias are adjacent to shallow trench isolation regions of the semiconductor device.

9. The semiconductor device of claim 1, wherein the first plurality of vias and the second plurality of vias are long bar vias.

10. The semiconductor device of claim 1, wherein the first plurality of vias and the second plurality of vias terminate on different planes within the semiconductor device.

11. A semiconductor device comprising:
 a first set of vias connecting a backside metallization level of the semiconductor device to a frontside metallization level of the semiconductor device; and
 a second set of vias connecting the backside metallization level of the semiconductor device to the frontside metallization level of the semiconductor device,
 wherein at least one via of the first set of vias and at least one via of the second set of vias are directly connected to at least one different wiring level on the frontside metallization level or the backside metallization level, and the first set of vias are connected to a first single wiring level and the second set of vias are connected to a second single wiring level, and wherein the first plurality of vias and the second plurality of vias extend continuously from the backside metallization level to the frontside metallization level.

12. The semiconductor device of claim 11, wherein the first set of vias and the second set of vias are dual damascene.

13. The semiconductor device of claim 11, wherein one via of the first set of vias and one via of the second set of vias are directly connected to one same wiring level on the frontside metallization level or the backside metallization level.

14. The semiconductor device of claim 11, wherein the first set of vias and the second set of vias are made of different metals.

15. The semiconductor device of claim 11, wherein a first via of at least one of the first set of vias has a first width and a second via of at least one of the second set of vias has a second width, and the first width is greater than one and a half times the second width.

16. The semiconductor device of claim 11, wherein the first set of vias and the second set of vias are long bar vias.

17. The semiconductor device of claim 11, wherein the at least one via of the first set of vias and the at least one via of the second set of vias terminate on different planes within the semiconductor device.

18. The semiconductor device of claim 11, further comprising:

one or more source/drain regions, wherein the second set of vias is adjacent to at least one of the one or more source/drain regions.

\* \* \* \* \*